United States Patent
Kanev et al.

(10) Patent No.: US 9,194,885 B2
(45) Date of Patent: Nov. 24, 2015

(54) MODULAR PROBER AND METHOD FOR OPERATING SAME

(75) Inventors: Stojan Kanev, Thiendorf OT Sacka (DE); Botho Hirschfeld, Dresden (DE); Axel Becker, Dresden (DE); Ulf Hackius, Dresden (DE)

(73) Assignee: Cascade Microtech, Inc., Beaverton, OR (US)

(*) Notice: Subject to any disclaimer, the term of this patent is extended or adjusted under 35 U.S.C. 154(b) by 212 days.

(21) Appl. No.: 13/820,098

(22) PCT Filed: Sep. 2, 2011

(86) PCT No.: PCT/EP2011/065169
§ 371 (c)(1),
(2), (4) Date: Sep. 23, 2013

(87) PCT Pub. No.: WO2012/028705
PCT Pub. Date: Mar. 8, 2012

(65) Prior Publication Data
US 2014/0145743 A1    May 29, 2014

(30) Foreign Application Priority Data

Sep. 3, 2010  (DE) .................. 10 2010 040 242

(51) Int. Cl.
*G01R 1/04* (2006.01)
*G01R 31/26* (2014.01)
*G01R 31/28* (2006.01)
*G01R 31/319* (2006.01)

(52) U.S. Cl.
CPC .......... *G01R 1/0408* (2013.01); *G01R 31/2601* (2013.01); *G01R 31/2868* (2013.01); *G01R 31/31907* (2013.01)

(58) Field of Classification Search
CPC .... H01L 21/67167–21/67184; G01R 31/2601; G01R 1/0408

USPC ..................... 324/757.01; 414/935
See application file for complete search history.

(56) References Cited

U.S. PATENT DOCUMENTS 6,111,421 A     8/2000  Takahashi et al.
6,420,864 B1 *  7/2002  Abraham et al. ........ 324/757.01
(Continued)

FOREIGN PATENT DOCUMENTS

DE    10246232 A1    4/2004
DE    20319625 U1    4/2004
(Continued)

OTHER PUBLICATIONS

Printout of Applied Materials website; URL: http://www.caeonline.com/listing/product/67525/applied-materials-orbot-wf-736, retrieved Feb. 28, 2013.
(Continued)

*Primary Examiner* — Tung X Nguyen
*Assistant Examiner* — Zannatul Ferdous
(74) *Attorney, Agent, or Firm* — Dascenzo Intellectual Property Law, P.C.

(57) ABSTRACT

The invention relates to a prober for checking and testing electronic semiconductor components and methods of using the same. The prober comprises at least two checking units, each of which is equipped with a chuck, probes, and a positioning unit, and each of which is assigned to a machine control system and a process control system. The prober further comprises a loading unit for automatically loading both testing units and an additional loader for manually loading at least one of the testing units, a user interface, and a module control system for controlling the process control systems and/or the machine control systems and the loading unit. The user interface can optionally be connected to at least one of the process control systems or the module control system by means of a switching device of the prober.

11 Claims, 4 Drawing Sheets

(56) References Cited

U.S. PATENT DOCUMENTS

| | | | |
|---|---|---|---|
| 8,922,229 B2 * | 12/2014 | Hirschfeld et al. | 324/754.01 |
| 2003/0028343 A1 | 2/2003 | Velichko et al. | |
| 2005/0083036 A1 * | 4/2005 | Schneidewind et al. | 324/158.1 |
| 2008/0116918 A1 * | 5/2008 | Kanev et al. | 324/754 |

FOREIGN PATENT DOCUMENTS

| | | |
|---|---|---|
| DE | 102004041102 A1 | 4/2005 |
| EP | 1049453 A2 | 11/2000 |
| WO | WO 99/49500 | 9/1999 |

OTHER PUBLICATIONS

English-language abstract of German Patent Publication No. DE20319625U1, published Apr. 8, 2004.

English-language abstract of German Patent Publication No. DE10246232A1, published Apr. 22, 2004.

English-language abstract of German Patent Publication No. DE102004041102A1, published Apr. 7, 2005.

* cited by examiner

MODULAR PROBER AND METHOD FOR OPERATING SAME

The invention generally relates to a testing station for checking and testing electronic semiconductor devices, generally referred to as a prober. In particular, it relates to such a prober in which a common handling system supplies at least two sample holders with the semiconductor devices to be tested and in which at least some steps connected with the test procedure can be automated.

The invention also relates to a process for carrying out an at least partly automated test procedure by means of such a prober.

To measure electronic components, for example for the purpose of checking their function or aging, contact tips are brought into contact with contact islands on the front of the components, electrically connecting them with test equipment that measures the properties of the individual components. The contact tips apply and/or tap the corresponding signals.

Probers check the electrical properties of the most diverse electronic semiconductor devices are or put them through special tests in this way. This can be done when the components are in various stages of manufacture and integration. Thus, tests are carried out of semiconductor chips, hybrid components, micromechanical, microoptical, and similar components that are still in a wafer sandwich or by themselves or already integrated in circuits of greater or lesser complexity. From time to time, e.g. during development, it also happens that there are only individual fragments that have irregular shapes and dimensions or that call for special development-related testing tasks, and these require completely manual testing. As a generalization, the electronic semiconductor devices to be tested are also referred to as test substrates.

In general, the development and manufacturing of the test substrates require that the most diverse tests and checking be carried out in the various stages of manufacture. As is known, this is done using probers essentially comprising a chuck with a surface to hold test substrates. The chuck can usually be moved in the X- and Y-direction. The prober also has a probe holder with the probes to make electrical contact with the test substrates. Making electrical contact requires not only the ability to move in the X-Y plane, which is always defined as the plane in which the chuck's holding surface lies, but also relative motion between the probes and the test substrates in the Z direction. The required movements in the Z direction can usually be performed by the chuck in connection with a positioning device of the probe holder.

The most diverse positioning devices are known for moving the chuck and/or the probes and/or the probe holder, and different resulting sequences of motions are known that can be used to execute the relative movements required for positioning the probes and/or test substrates and for the probes to make contact. As the integration density increases, the size of the contact surfaces decreases, placing greater and greater requirements on the exactness of probe and test substrate positioning, especially if it is necessary for the individual positions of many test substrates in a wafer sandwich or individually arranged in a grid on the chuck to be approached one after the other. To do this, the wafer or the individual test substrates are arranged on the chuck so that their grid coincides very precisely with the X and Y direction of motion of the chuck or the probes, i.e., the grid and the corresponding directions of motion of the positioning devices are in-line. Then, the individual positions of the test substrates can also be approached in an automated manner by traveling over the grid step by step in the X or Y direction.

For fully automatic and thus operator-free testing and to achieve a high testing throughput, placement of the test substrates on the chuck and changing them is also automated using a correspondingly equipped handling system. This system lays a test substrate down on the chuck and removes it again after the testing process. The test substrates can also be removed from magazines and put into them by a handling system. To allow precise placement, which clearly reduces the subsequent effort to position them relative to the probes, it is also possible to arrange an alignment station that aligns a test substrate relative to a reference before placement on the chuck, which is fed by the handling system.

For example, DE 10 2004 041 102 AI describes a prober that has a buffer module integrated into it to compensate for greater time differences between the test and the positioning; this module carries out pre- or post-processing such as temperature equalization of the test, and is served together with at least one other test module and two substrate magazines by a handling system. This prober can be used for individual measurements, e.g., as a laboratory prober in development, and also as a fully automatic prober.

In addition to the actual test setup, consisting essentially of a chuck with a motorized drive, individual probes or a probe card, control electronics, and corresponding means of holding and connecting, as described above, a fully automatic prober comprises a pattern recognition system for self-adjustment of the wafer slice, a CCD camera or microscope to observe the test substrate, a monitor, a handling system, a wafer slice magazine station, and an alignment station.

Fully automatic probers are also known as components of wafer processing systems used in the manufacturing of electronic semiconductor devices. They have a handling system centrally arranged to the treatment and testing chambers and after several test substrates are put into the system, usually by means of cassettes or magazines, the handling between the individual stations of a run is carried out in a fully automatic manner (U.S. Pat. No. 6,420,864 B1). Here suitable interfaces with means of display and communication can also allow an operator to monitor the process or intervene into it by means of a control unit.

Such automated probers have been found to have the disadvantage that the entire sequence of events, especially handling, is tailored to certain test substrates, and changing them or the test sequence is impossible or involves unreasonable effort.

Thus, the invention has the purpose of describing a prober for automated testing of test substrates in which it is also possible to test individual test substrates of different types and shapes from others and/or carry out special tests tailored to individual test substrates.

A prober is described that has various modules that can be combined together in various ways by means of a switching device of the prober, so that either fully automatic or semiautomatic operation can be selected by switching. To accomplish this, the modules themselves are configured in such a way that their tasks can be carried out in either a manual or in an automated manner, and modules are added that serve for at least partly manual or automated testing. This allows the described prober to be used for individual tests as well as for fully automatic tests.

Individual tests are considered when repeated tests are impossible or unnecessary because of a special test substrate, e.g., a wafer fragment, or because a test has separate test conditions or a separate test sequence.

In particular, two separate test devices are arranged as modules; each of these test devices is connected with its own machine control system and its own process control system, and in this arrangement can function as its own prober in the conventional meaning.

To do this, every test unit comprises its own chuck to receive and hold a test substrate on the chuck's holding surface; its own probe holder with an arrangement of several probes to make electrical contact with a test substrate; and its own positioning unit with motorized drives to position the chuck and probe arrangement relative to one another.

Together with every test unit's machine control system, which is the power control system to control the motorized drives of the respective test unit, and with the process control system that every test unit also has to control the test process of the respective test unit, every test unit can independently carry out various tests of test substrates, as is common knowledge from the prior art.

This also includes that a storage unit associated with one of the two machine control systems stores positioning sequences, and a storage unit associated with one of the two process control systems stores data of the test substrate and test sequences. The stored data about the test substrates, such as, e.g., the so-called wafer maps about the position and size of a test substrate component's contact surfaces to be simultaneously contacted with the probes, and possibly also the grid element spacings of the repeating structures, and about positioning and test sequences, allow automated execution of individual steps of the test procedure. In the case of the above-mentioned stored data this involves, e.g., approaching the next repeating structure of a wafer with test substrate structures of the same kind arranged in a grid after a first positioning and testing. The test sequence itself can also be carried out in an automated manner with respect to the signals to be applied and received; a first processing of the received signals; or with respect to a special treatment of the test substrate before, after, or during the test.

As will be described below, the various combinations of prober modules mean that data storage in only one machine or process control system is already sufficient; optionally, it is also possible for both the machine or process control systems to have the mentioned data storage.

Furthermore, the prober comprises devices to load the test units with test substrates, both a loader that allows the chuck to be loaded manually, i.e., by an operator, and also a loading unit that is equipped with a handling system for automated acceptance and transfer of a test substrate between a test substrate storage device, e.g., a magazine, and both test units.

Arranging two or more test units equipped in this way allows not only fully automatic or semiautomatic testing, but also a combination of the two methods in only one prober.

In this description, fully automatic operation is intended to mean operation of at least one of the prober's test units, in which the loading of the test unit with a test substrate, its positioning relative to the probe arrangement by means of the positioning unit associated with the test unit, making contact between the test substrate and the probes, and performing all measurements necessary for the test are done in a completely automated manner according to a stored positioning and measurement regimen, and do not involve operator intervention.

For fully automatic operation, at least one of the test units is connected with the prober's module control system, which is also connected with the prober's loading unit. According to the embodiment of the module control system, the test process can be controlled just by the module control system in the connected test unit. In this case, all required test sequences that are otherwise stored in the process control system of a conventional prober are stored in a storage unit of the module control system, and the module control system communicates directly with the test unit and the machine control system. Alternatively, the module control system can also access the process control system and the test sequences stored there and only coordinate them including the machine control system. According to this alternative embodiment of test unit control, if the module control system does not have any user interface of its own, the module control system can be connected with a user interface of the prober by means of the switching device. In the various embodiments more than one, possibly even all test units can also be operated in a fully automatic manner.

By contrast, semiautomatic operation is intended to mean operation of at least one of the prober's test units, in which at least the chuck of the test unit that is connected with the user interface is loaded manually, and thus for individual test substrates. Because of the high requirements on the precision of position, manual loading can involve the use of means of assistance that can also include motorized manipulators. Individual steps for positioning the test substrate lying on the chuck relative to the probe position can also be done in an automated manner, i.e., according to stored positioning steps that can be defined on the basis of a wafer map stored in the machine control system as next positions, e.g., after the precise approach of a first or reference position.

The possibility of manual loading by connecting the test unit in question with a user interface allows the test unit to be used separately as a conventional prober.

One embodiment of prober operation also allows other steps of the test procedure to be carried out manually in the manually operated test unit, i.e., with an operator actively influencing them. Thus, the test substrate lying on the chuck and the probes can be positioned relative to one another at least partly through inputs on the user interface that allow operation of the motorized drives. For this purpose, the user interface can have not only a display and input device for monitoring and influencing the testing, but also a manipulation device. The manipulation device allows defined positions and/or positions to be monitored by means of an observation device to be approached manually with controlled drives. In the simplest case, such a manipulation device is a joystick. However, a mouse or a visual joystick operated with the input device, or other devices are also possible.

The invention is explained in detail below using a sample embodiment. The associated drawings are as follows.

Figure 1:
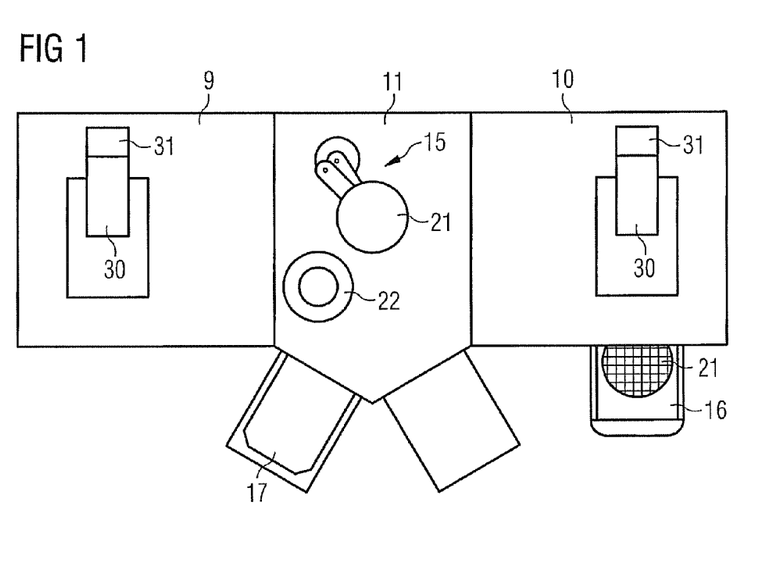
FIG. 1 a schematic representation of a prober with two test units and loading unit.

The prober schematically illustrated in FIG. 1 comprises a first test unit 9 and a second test unit 10, which are arranged in a line with a loading unit 11, so that the loading unit 11 is located between the two test units 9, 10 and can supply both with test substrates 21.

The central loading unit 11 comprises a handling system 15 that is only schematically shown in FIG. 1. Such handling systems are generally known. A handling system 15 that is usually used for testing electronic semiconductor devices is described in DE 10 2004 041 102 AI, for example. It regularly comprises one or more robot arms that are linked to a robot drive. The free front of the outermost robot arm has a diskshaped receptacle arranged on it that can receive the bottom of a test substrate 21, in the sample embodiment a wafer, and hold it by applying vacuum.

Furthermore, loading unit 11 has a test substrate storage device mounted on it in the form of a wafer magazine 17, from which handling system 15 takes test substrates 21, transfers them to first test unit 9, and after they are tested takes them back from there and stores them in wafer magazine 17.

Wafer magazine 17 and handling system 15 have an alignment station 22 arranged between them. A wafer 21 taken from wafer magazine 17 is placed on it before being transferred to first test unit 9. In this alignment station 22 the position of wafer 21 is adjusted so that it is already correctly oriented for transfer and only requires fine adjustment in first test unit 9 before testing.

As described above, both test units 9, 10 can be used in a very flexible manner, both for fully automatic and for semi-automatic testing. Accordingly, loading unit 11, including handling system 15 and possibly alignment station 22, is configured and centrally arranged so that it can supply each test unit 9, 10 with test substrates 21 and access one or more test substrate storage devices.

Usually, loading unit 11 is used for automatic changing of test substrates 21 for test units 9, 10, and thus mostly for fully automatic testing. However, loading unit 11 can also equally well be used to supply test unit 9 or 10 with an individual test substrate 21, as long as its geometric shape can be handled by the handling system. This concerns individual wafers 21 as well as, e.g., irregularly shaped test substrates 21 or isolated electronic components that have already been obtained from suitable carrier substrates.

First test unit 9 and second test unit 10 are shown in top view with a housing 29 that is closed, so that the components of test units 9, 10 cannot be seen in FIG. 1. The essential structure of first test unit 9 is schematically shown in FIG. 2 and when considered alone corresponds to the usual structure of a separate test station for testing electronic semiconductor devices.

Figure 2:
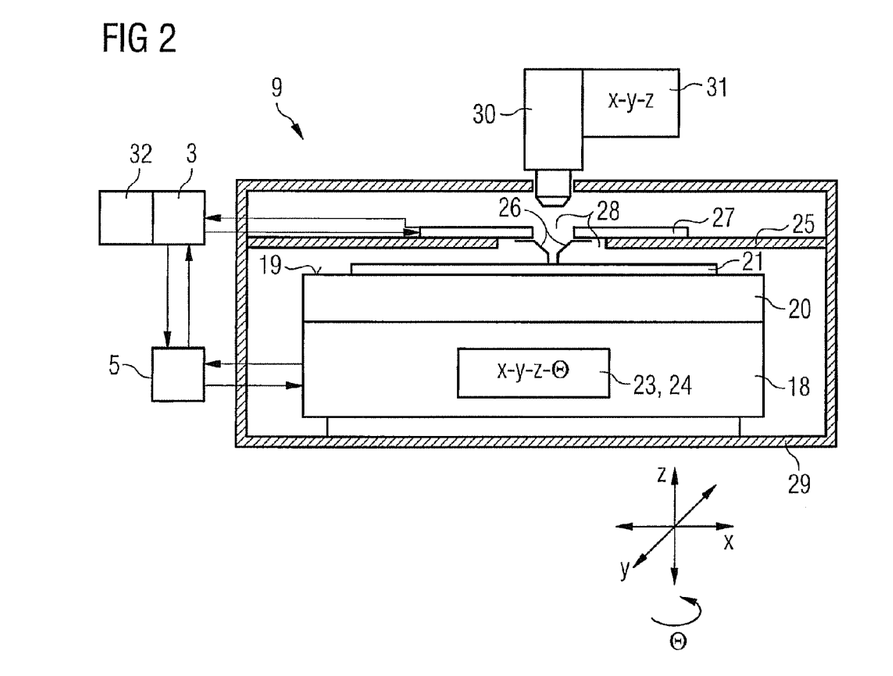
FIG. 2 a schematic representation of a first test unit.

As can be seen in FIG. 2, a first test unit 9 comprises a chuck 18 with a holding surface 19 to hold test substrates 21. In the sample embodiment shown, holding surface 19 is the top surface of a supporting plate 20 that can be removed from chuck 18.

First test unit 9 also comprises a probe holder 25, arranged opposite holding surface 19. Probe holder 25 holds a number of probes 26 arranged relative to one another so as to correspond with the arrangement of the contact surfaces (not shown) of test substrate 21 with which simultaneous contact should be made. Probes 26 in their defined position to one another are generally referred to as probe arrangement 26. In the sample embodiment shown, probe arrangement 26 is fixed to a so-called probe card 27.

A probe card 27 is usually a printed circuit board that has the precisely oriented needle-shaped probes 26 fixed to it and track conductors serving as leads to the individual probes 26. Alternatively, it is also possible for separate probes 26 to be mounted on the probe holder 25. Frequently, separate probes 26 can also be aligned with one another directly on probe holder 25 by means of suitable manipulators (not shown). Such separate probes 26 are usually used for individual measurements, for which it would be too expensive to produce a probe card 27.

To position test substrate 21 and probe arrangement 26 relative to one another, first test unit 9 also comprises a positioning unit 23. Its structure can be very different, depending on what components are supposed to be moved. Positioning unit 23 usually comprises a drive 24 for chuck 18, to move it in the X, Y, and usually also in the Z direction. For angular alignment, chuck 18 can regularly pivot about an angle Θ. The position of X, Y, and Z direction and the angle Θ can be seen in the pictogram in FIG. 2 and corresponds to the usual orientation. Drive 24 of chuck 18 can be manually operated or motorized. For automated sequences of motions, a motorized drive 24 is arranged, which is controlled by a machine control system, in FIG. 2 the first machine control system 5.

For probe arrangement 26 to make electrical contact on test substrate 21, not only must test substrate 21 be able to move in the X-Y plane, which is usually defined as the plane in which the holding surface 19 of chuck 18 lies, but probe arrangement 26 and test substrate 21 must also be able to move relative to one another in the Z direction. In the sample embodiment with a probe card 27, the required movements in the Z direction are carried out by chuck 18 alone. Alternatively, the final advancement of the probe can also be done by combining movement of the chuck with a movement of probe arrangement 26 in the Z direction. In this case, the probes also have manipulators (not shown), which can be manual or motorized. All mentioned components for moving test substrate 21 and probes 26 relative to one another for the purpose of positioning and making contact are associated with positioning unit 23.

To observe the positioning and contacting, first test unit 9 has an observation unit 30 that can be moved by means of its own controller 31 in the X, Y, and Z directions to make the entire contact area visible at the required resolution. Observation is done through corresponding central openings 28 in probe holder 25 and in probe card 27, and also in housing 29, which surrounds the described components.

To control the test sequence to be carried out with first test unit 9, the latter also comprises a first process control system 3. It controls all sequences of events concerning probe arrangement 26, including signal transmission and the movement of chuck 18. The latter is done through first machine control system 5, which converts the control signals into power signals. Accordingly, the process control is connected both with probe arrangement 26 and also with first machine control system 5. Alternatively, machine control system 5 can also be a part of process control system 3. Storage unit 32 of first process control system 3 retrievably stores all data required for test sequences, in particular test substrate data, data for controlling the test signals, and data for positioning and making contact.

Figure 2A:
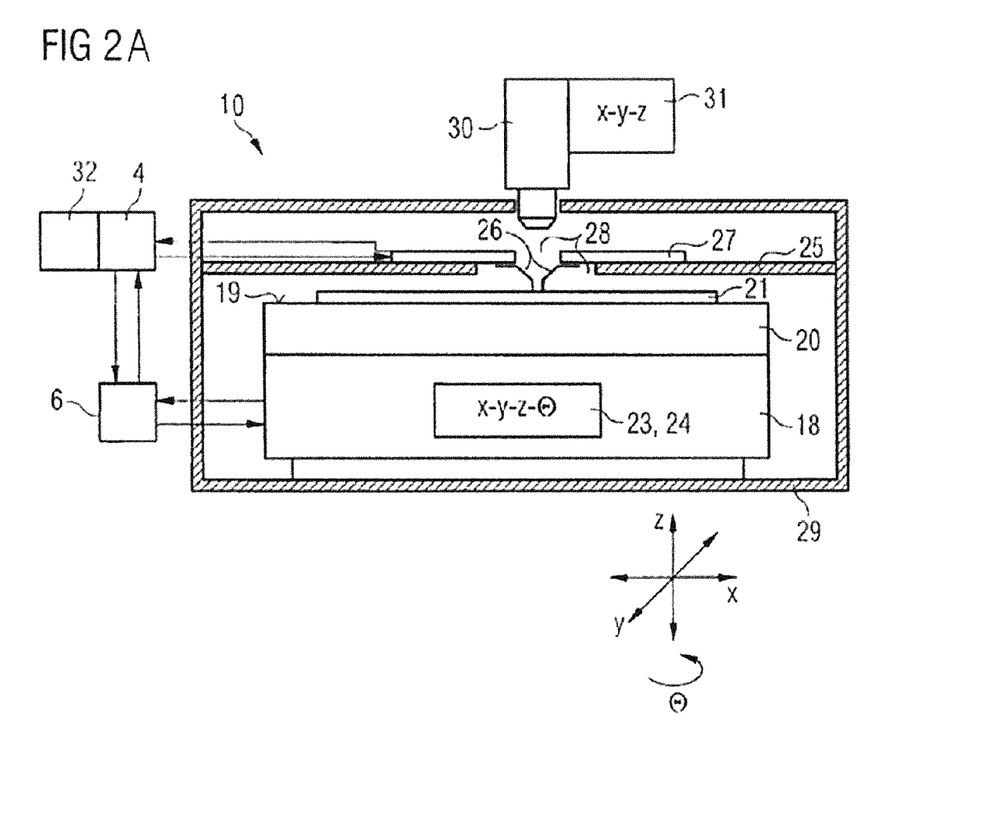
FIG. 2A a schematic representation of a second test unit.

The prober shown in FIG. 1 has two of the test units 9, 10. They have the same basic structure, with this structure being illustrated in FIG. 2 for first test unit 9 and in FIG. 2A for second test unit 10. The various components of first test unit 9, which are illustrated in FIG. 2, also may be referred to herein as "first" components, respectively. As examples, first test unit 9 of FIG. 2 may be referred to herein as including a first chuck 18 with a first holding surface 19, a first support plate 20 that may support a first test substrate 21, a first positioning unit 23, a first motorized drive 24, a first probe holder 25, a first probe arrangement 26, a first probe card 27, first central openings 28, a first housing 29, a first observation unit 30, and a first control system 31 of the observation unit. The various components of second test unit 10, which are illustrated in FIG. 2A, also may be referred to herein as "second" components, respectively. As examples, second test unit 10 of FIG. 2A may be referred to herein as including a second chuck 18 with a second holding surface 19, a second support plate 20 that may support a second test substrate 21, a second positioning unit 23, a second motorized drive 24, a second probe holder 25, a second probe arrangement 26, a second probe card 27, second central openings 28, a second housing 29, a second observation unit 30, and a second control system 31 of the observation unit. As illustrated in FIG. 1, second test unit 10 has an additional loader 16. An operator can use this loader to load a test substrate 21 into chuck 18 manually; loader 16 can travel through a closeable opening (not shown) in the front of housing 29 of the second test unit between a loading position outside the housing and a position inside that is close to the chuck, and it has means (not shown) to pick up and transfer the chuck's support plate 20, so that it can exchange test substrates 21 with it. Such loaders are sufficiently known from the prior art, e.g., from DE 102 46 232 AI. Using loader 16, test substrates 21 can be brought into the prober independently of loading unit 11.

In the sample embodiment shown, only the second test unit 10 has a loader 16. To make the prober more flexible, the first test unit 9 can also be equipped with a loader.

Testing involves simultaneously setting probe arrangement 26 on the contact surfaces of a test substrate 21 and applying a signal to it or tapping a signal from it. Then, contact is broken and the next test substrate 21 or the next arrangement of contact surfaces in the X or Y direction on the same test substrate 21 is approached and contact is made with it to test it. This testing can be done under the special test conditions that are set up within the housing, such as, e.g., tests under special environmental and temperature conditions, low-current and low-voltage measurements, and other tests. Depending on the application and equipment of test units 9, 10, both can carry out the same tests on test substrate 21, or they can carry out different tests.

Figure 3:
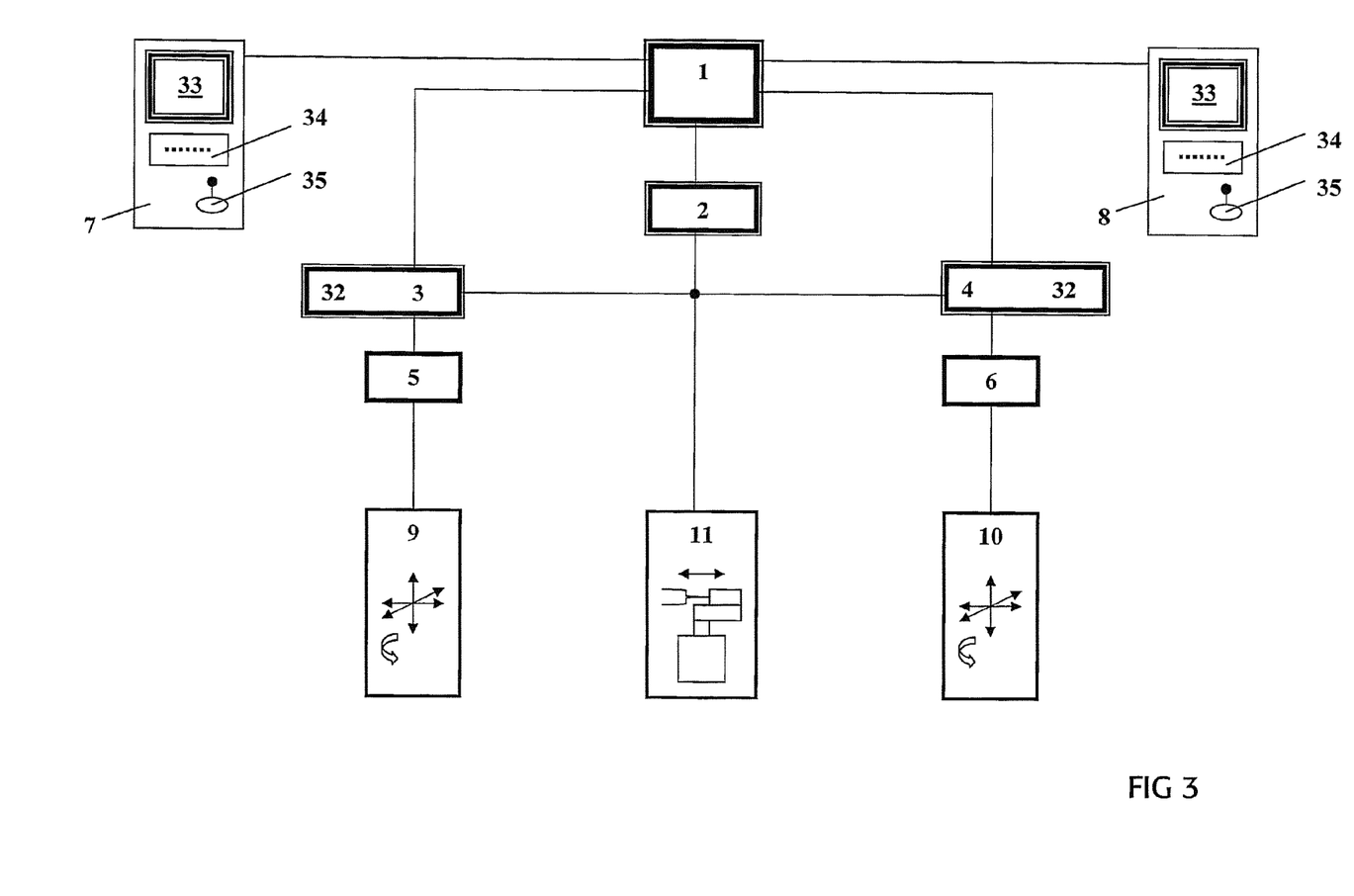
FIG. 3 a block diagram of the prober shown in FIG. 1 also showing the control systems and the switching device.

The interaction of the previously described components of the prober is shown in the block diagram in FIG. 3.

In it, the first and second test units 9, 10 are directly connected with the first or second machine control system 5, 6, and through the latter they are connected with the first or second process control system 3, 4. Both process control systems 3, 4 comprise their own storage unit 32. To give a better overall view, FIG. 3 shows the process and machine control systems 3, 4, 5, 6 separately from the associated test units 9, 10. However, the control systems are usually integrated into each test unit. The process control systems 3, 4 are connected with a module control system 2 and, parallel to it, with loading unit 11. To give a better overall view, the pictograms label the test units and loading unit in a specific action.

Moreover, the process control systems 3, 4 and the module control system 2 and in addition a first user interface 7 and a second user interface 8 are each connected with a central switching device 1. Both user interfaces 7, 8 comprise a display device 33 (display) and an input device 34 (keyboard). In the sample embodiment, each user interface 7, 8 also has a manipulation device 35 in the form of a joystick with which the motorized drives 24 can be operated, possibly with the help of observation unit 30. As is known, the functions of manipulation devices 35 can frequently be carried out by a keyboard, so the manipulation device can also be omitted.

In the sample embodiment, the switching device corresponding to the components of the user interface 7, 8 is a so-called KVM switch (Keyboard-Video-Mouse switch), which allows several control systems to be controlled with only one such user interface. Alternatively, other switching devices 1 can also be used, if they are able to connect the terminal equipment that is connected with switching device 1 (in this case the process and module control systems 2, 3, 4) with a user interface 7, 8.

As a consequence of this central function of switching device 1 and the above-described functions of the individual test units 9, 10 and loading unit 11, connecting at least one of the user interfaces 7, 8 with the different control systems 2, 3, 4 makes it possible to set up various operating states in which semiautomatic or fully automatic operation of the associated test units 9, 10 is possible in quite different combinations.

The second and third columns of the table below show the operating modes of test units 9 and 10 and loading unit 11, subdivided into the possible operating states A through E (column one). The fourth and fifth columns name the control systems that are connected with the first user interface 7 or with the second user interface 8. The first process control system 3 is referred to as PS I, the second process control system 4 is referred to as PS II, and the module control system 2 is referred to as MS.

| | Component | | | | |
|---|---|---|---|---|---|
| | First test unit 9 (PE I) | Second test unit 10 (PE II) | Loading unit 11 (LE) | First user interface 7 (BO I) | Second user interface 8 (BO II) |
| A | fully automatic | fully automatic | fully automatic | MS, PS I, PS II | passive |
| B | fully automatic | fully automatic | fully automatic | MS, passive | MS, PS I, PS II |
| C | semiautomatic | fully automatic | fully automatic | PS I | MS PS II |
| D | fully automatic | semiautomatic | fully automatic | MS, PS I | PS II |
| E | semiautomatic | semiautomatic | passive | PS I | PS II |

According to the table, in operating state A switching unit 1 connects the first user interface 7 with module control system 2 and through it with loading unit 11 and with both process control systems 3, 4. The second user interface 8 is not required and is passive. In this operating state, both test units are fully automatic, and loading unit 11 loads them in a fully automatic manner with test substrates 21 from a test substrate storage device 17. Module control system 2 only coordinates process control systems 3, 4 and loading unit 11; the test sequences and drives 24 are actually controlled through the respective process control system 3, 4.

As described above, module control system 2 can also alternatively assume complete control of the test sequences. This is possible, e.g., when both test sequences are the same. In this case, module control system 2 would also have its own storage unit 32 (not shown), and module control system 2 can be connected to machine control systems 5, 6 instead of to process control systems 3, 4. Moreover, module control system 2 alternatively need not be connected to the first user interface 7, if the tests are fully automatic and/or the module control system has a minimal user interface which only allows, e.g., testing to be started and ended or the test to be observed. Switching between these various alternatives can also be done in a flexible manner by supplementary switching devices (not shown).

Operating state B is comparable to operating state A; in operating state B, corresponding switching states of switching device 1 make the second user interface 8 assume the place of first user interface 7. All other connections and associated modes of operation correspond to those of operating state A.

Operating states C and D are characterized by fully automatic operation of one test unit 9, 10 and semiautomatic operation of the other. To accomplish this, switching device 1 first connects the second test unit 10 with the loading unit and with the module control system 2 into a module whose second test unit 10 works in a fully automatic manner and accordingly is loaded in a fully automatic manner through loading unit 11. This fully automatic module is operated by the second user interface 8; alternatively, as described above, with the corresponding equipment it is also possible for module control unit 2 to assume the functions of the second user interface 8.

In this operating state C, the first test unit 9 together with the first user interface 7 are left to semiautomatic operation, these two components also being connected with one another by switching device 1 and separated from the fully automatic module. The two components form a semiautomatic module.

Operating state D represents a mirror image counterpart with respect to the use of the first and second test units 9, 10 and the first and second user interfaces 7, 8 for semiautomatic and fully automatic operation, i.e., for their use in the fully automatic and semiautomatic module.

Finally, in operating state E both test units 9, 10 operate in semiautomatic mode, each test unit 9, 10 being connected by means of the switching device with a user interface 7, 8. Here the module control system 2 and loading unit 11 are passive.

As described above, one user interface can replace the function of the other for both semiautomatic and fully automatic operation in the various operating states, so it is also possible to equip the prober with only one user interface 7 or 8 or to give the two interfaces different capabilities and use the user interface 7 or 8 with greater capabilities when the operating requirements are greater. Then it would be sufficient, e.g., to integrate a high-quality manipulation device 35 in only one user interface 7 or 8.

As a result, the described prober has very great flexibility with respect to quite different applications. The fully automatic and semiautomatic modules can be put together in different ways, so that with differently equipped components, e.g., user interfaces 7, 8, process and/or machine control systems 3, 4, 5, 6 and/or test units 9, 10 of the modules, it is possible for quite different testing tasks to be carried out and combined in one prober. Of course the modules can also be operated individually.

LIST OF REFERENCE NUMBERS

1 Switching device
2 Module control system
3 First process control system
4 Second process control system
5 First machine control system
6 Second machine control system
7 First user interface
8 Second user interface
9 First test unit
10 Second test unit
11 Loading unit
12 Display device
13 Input device
14 Manipulation device, joystick
15 Handling system
16 Loader
17 Test substrate storage device, wafer magazine
18 Chuck
19 Holding surface
20 Support plate
21 Test substrate, wafer
22 Alignment station
23 Positioning unit
24 Drive
25 Probe holder
26 Probe arrangement, probes
27 Probe card
28 Central openings
29 Housing
30 Observation unit
31 Control system of observation unit
32 Storage unit
33 Display device
34 Input device
35 Manipulation device

The invention claimed is:

1. A prober for testing a test substrate, the prober comprising:
   a first test unit that includes:
   (i) a first chuck that defines a first holding surface that is configured to receive and hold the test substrate;
   (ii) a first probe holder that includes a first plurality of probes that is configured to form a plurality of first electrical connections with the test substrate; and
   (iii) a first positioning unit that includes a first motorized drive and is configured to position the first chuck relative to the first plurality of probes;
   a second test unit that includes:
   (i) a second chuck that defines a second holding surface that is configured to receive and hold the test substrate;
   (ii) a second probe holder that includes a second plurality of probes that is configured to form a plurality of second electrical connections with the test substrate; and
   (iii) a second positioning unit that includes a second motorized drive and is configured to position the second chuck relative to the second plurality of probes;
   a loading unit that includes a handling system and is configured to selectively and automatically convey the test substrate between a first test substrate storage device and either of the first test unit and the second test unit;
   an additional loader that is configured to be manually controlled by an operator to directly transfer the test substrate between a second test substrate storage device and the second test unit;
   a first machine control system configured to control the first motorized drive;
   a second machine control system configured to control the second motorized drive;
   a first process control system configured to control the operation of the first test unit when testing the test substrate;
   a second process control system configured to control the operation of the second test unit when testing the test substrate;
   a data storage unit that is configured to store testing information regarding the test substrate, wherein the data storage unit is in data transfer communication with at least one of the first process control system and the second process control system;
   a module control system that is configured to selectively control the operation of at least one of:
   (i) the first process control system and the second process control system; and
   (ii) the first machine control system, the second machine control system, and the loading unit;
   a user interface that includes a display and an input device; and
   a switching device that is configured to selectively form an electrical connection between the user interface and each of:
   (i) the first process control system;
   (ii) the second process control system; and
   (iii) the module control system.

2. The prober of claim 1, wherein the second chuck of the second test unit further includes a support plate that defines the second holding surface, and further wherein at least one of the additional loader and the loading unit is configured to remove the support plate from the second test unit.

3. The prober of claim 1, wherein the user interface further includes a manipulation device that is configured to be manually actuated to operate at least one of the first motorized drive and the second motorized drive.

4. The prober of claim 1, wherein at least one of the first test unit and the second test unit is configured to carry out low-current and low-voltage measurements.

5. The prober of claim 1, wherein the user interface is a first user interface, wherein the prober further includes a second user interface, and further wherein the switching device is configured to selectively form an electrical connection between each of:
   (i) the first user interface and the first process control system;
   (ii) the first user interface and the module control system;
   (iii) the second user interface and the second process control system; and
   (iv) the second user interface and the module control system.

6. The prober of claim 1, wherein the additional loader is configured to transfer the test substrate between the second test substrate storage device and the second test unit without the test substrate being passed through the loading unit.

7. A method of operating the prober of claim 1, the method comprising:
   configuring the switching device such that the module control system is in electrical communication with the user interface and automatically controls the operation of a selected test unit of the first test unit and the second test unit by:
      loading a test substrate onto a chuck of the selected test unit;
      positioning the test substrate and a plurality of probes of the selected test unit relative to one another;
      bringing the test substrate and the plurality of probes of the selected test unit into contact with one another; and
      testing the test substrate with the selected test unit.

8. The method of claim 7, wherein the automatic control further includes controlling the selected test unit with the module control system by at least one of:
   (i) directly controlling the selected test unit based upon test sequences that are stored in a storage unit of the module control system; and
   (ii) activating a selected process control system that is in communication with the selected test unit to control the selected test unit based upon test sequences that are stored in the data storage unit.

9. A method of operating the prober of claim 1, the method comprising:
   configuring the switching device such that the user interface is in electrical communication with a selected process control system of the first process control system and the second process control system; and
   semi-automatically controlling the operation of the selected process control system by manually loading a test substrate onto a chuck of a selected test unit of the first test unit and the second test unit, which is associated with the selected process control system.

10. The method of claim 9, wherein the semi-automatically controlling further includes positioning the test substrate and a plurality of probes of the selected test unit relative to one another based, at least in part, on a user input to the user interface, wherein the positioning includes operating a motorized drive of the selected test unit.

11. The method of claim 9, wherein the semi-automatically controlling further includes at least one individual step for positioning the test substrate and a plurality of probes of the selected test unit relative to one another in an automated fashion.

* * * * *